(12) United States Patent
Kim et al.

(10) Patent No.: US 8,953,389 B2
(45) Date of Patent: Feb. 10, 2015

(54) SEMICONDUCTOR MEMORY DEVICE

(71) Applicant: SK Hynix Inc., Icheon-si, Gyeonggi-do (KR)

(72) Inventors: Kwang Soon Kim, Mokpo-si (KR); Keun Kook Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 231 days.

(21) Appl. No.: 13/718,975

(22) Filed: Dec. 18, 2012

(65) Prior Publication Data

US 2014/0016418 A1    Jan. 16, 2014

(30) Foreign Application Priority Data

Jul. 11, 2012 (KR) .................. 10-2012-0075791

(51) Int. Cl.
*G11C 7/10* (2006.01)
*G11C 7/06* (2006.01)
*G11C 5/02* (2006.01)
*G11C 7/08* (2006.01)
*G11C 7/18* (2006.01)

(52) U.S. Cl.
CPC .. *G11C 7/06* (2013.01); *G11C 7/10* (2013.01); *G11C 5/025* (2013.01); *G11C 7/08* (2013.01); *G11C 7/18* (2013.01)
USPC ................. 365/189.05; 365/205; 365/206

(58) Field of Classification Search
USPC .................... 365/189.05, 205, 206
See application file for complete search history.

(56) References Cited

U.S. PATENT DOCUMENTS

| | | | | |
|---|---|---|---|---|
| 5,604,710 A | * | 2/1997 | Tomishima et al. | 365/230.03 |
| 5,771,200 A | * | 6/1998 | Cho et al. | 365/230.03 |
| 6,847,576 B2 | * | 1/2005 | Kang | 365/230.03 |
| 7,463,518 B2 | * | 12/2008 | Park | 365/185.05 |
| 8,339,826 B2 | * | 12/2012 | Kim | 365/51 |

FOREIGN PATENT DOCUMENTS

KR    10-0855586 B1    8/2008
KR    10-2011-0052371 A    5/2011

* cited by examiner

*Primary Examiner* — Pho M Luu
(74) *Attorney, Agent, or Firm* — William Park & Associates Patent Ltd.

(57) ABSTRACT

A semiconductor memory device includes a first core region and a second core region disposed along a first reference line parallel to a major axis, the first reference line connecting an input pad and an output pad; first and second cell blocks disposed in the first core region along the first reference line; third and fourth cell blocks disposed in the second core region along the first reference line; and a repeater positioned between the third and fourth cell blocks, and configured to receive data outputted from the first cell block or the second cell block, amplify the received data and transfer the amplified data to a second global input/output line. Reducing the number of needed global input/output lines leads to layout area reduction. Moreover, since repeaters are driven in read operations for a limited number of cell blocks, signal gain may be reduced, thus reducing overall power consumption.

20 Claims, 3 Drawing Sheets

SEMICONDUCTOR MEMORY DEVICE

CROSS-REFERENCE TO RELATED APPLICATION

The present application claims priority under 35 U.S.C 119(a) to Korean Patent Application No. 10-2012-0075791, filed on Jul. 11, 2012 in the Korean Intellectual Property Office, which is incorporated herein by reference in its entirety.

BACKGROUND

Paths of a DRAM include a row address path, a column address path, and a data path. In the row address path, operations are performed to extract a row address from an input address, select a word line by the row address, and amplify, by a sense amplifier, the data of a memory cell connected to the selected word line. In the column address path, a column address is extracted from an input address by a column address control circuit, (hereafter, referred to as "a column address control operation") and an operation is performed to decode the column address and select a memory cell by selectively enabling an output enable signal. Finally, in the data path, the data of a bit line is output by operation of a selected output enable signal, or input data is stored to a memory cell through a bit line.

In a semiconductor memory device, it is usually the case that pads through which addresses, commands and data are inputted and outputted are disposed at the center portion of a chip. However, in a semiconductor memory device included in a mobile terminal, pads are typically disposed at peripheral regions. In particular, pads through which address information and commands are inputted are disposed at one peripheral region, and pads through which data are inputted and outputted are disposed at another peripheral region.

SUMMARY

In one embodiment, a semiconductor memory device includes: a first core region and a second core region disposed along a first reference line parallel to a major axis, the first reference line connecting an input pad and an output pad; first and second cell blocks disposed in the first core region along the first reference line; third and fourth cell blocks disposed in the second core region along the first reference line; and a repeater positioned between the third and fourth cell blocks, and configured to receive data outputted from the first cell block or the second cell block, through a first global input/output line in a read operation for the first cell block or the second cell block, amplify the received data and transfer the amplified data to a second global input/output line.

In another embodiment, a semiconductor memory device includes: a first control circuit unit positioned between first and second cell blocks which are disposed in a first core region along a first reference line parallel to a major axis, the first reference line connecting an input pad and an output pad, the first control unit connected with the first cell block through a first local input/output line, and connected with the second cell block through a second local input/output line; a second control circuit unit positioned between third and fourth cell blocks which are disposed in a second core region along the first reference line, connected with the third cell block through a third local input/output line, and connected with the fourth cell block through a fourth local input/output line; and a repeater positioned between the third and fourth cell blocks, and configured to receive data outputted from the first cell block or the second cell block, through a first global input/output line in a read operation for the first cell block or the second cell block, amplify the received data and transfer the amplified data to a second global input/output line, wherein the first core region and the second core region are disposed along the first reference line.

BRIEF DESCRIPTION OF THE DRAWINGS

The above and other features and advantages of will become readily apparent by reference to the following detailed description when considered in conjunction with the accompanying drawings wherein.

DETAILED DESCRIPTION

Hereinafter, embodiments will be explained in more detail with reference to the accompanying drawings. Although embodiments are described with reference to a number of examples thereof, it should be understood that numerous variations and modifications can be devised by those skilled in the art that will fall within the spirit and scope of the invention. Embodiments may be embodied in different forms and should not be construed as limited to the embodiments set forth herein.

Figure 1:
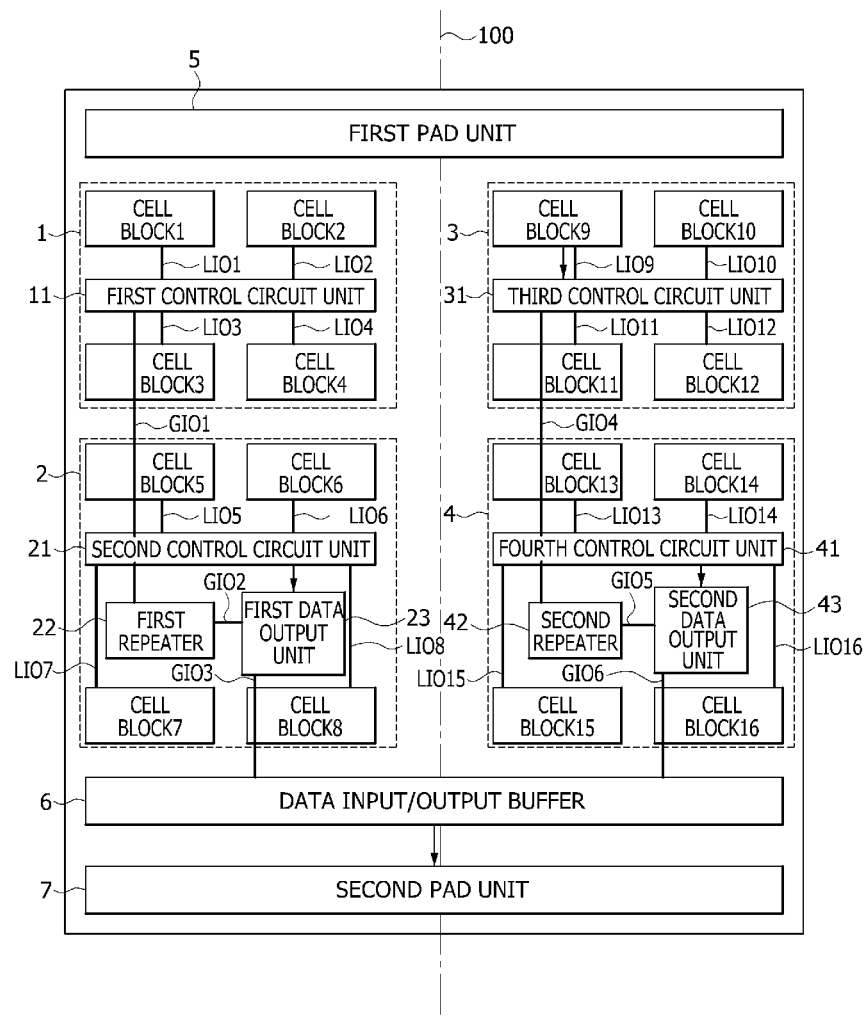
FIG. 1 is a block diagram showing the configuration of a semiconductor memory device in accordance with an embodiment.

In FIG. 1, a semiconductor memory device includes a first core region 1, a second core region 2, a third core region 3, a fourth core region 4, a first pad unit 5, a data input/output buffer 6, and a second pad unit 7. The first core region 1 and the second core region 2 are disposed along a first reference line (not shown) substantially parallel to a major axis 100, the first reference line connecting the first pad unit 5 and the second pad unit 7. The third core region 3 and the fourth core region 4 are disposed along a second reference line (not shown), lying on an opposite side of, and substantially parallel to, the major axis 100, the second reference line connecting the first pad unit 5 and the second pad unit 7. The first pad unit 5 receives addresses and commands. The data input/output buffer 6 receives data through the second pad unit 7 in a write operation and outputs data through the second pad unit 7 in a read operation. The first core region 1 and the third core region 3 lie on opposite sides of the major axis 100, and the second core region 2 and the fourth core region 4 also lie on opposite sides of the major axis 100. According to an embodiment, it may be envisaged that the first pad unit 5 and the second pad unit 7 are disposed at peripheral regions proximate a first end point and a second end point, respectively, of the major axis 100. The first core region 1 and the second core region 2 are disposed on a first side of the major axis 100, between the first pad unit 5 and the second pad unit 7, while the third core region 3 and the fourth core region 4 are disposed on an opposite side of the major axis 100, between the first pad unit 5 and the second pad unit 7.

The first core region 1 comprises first to fourth cell blocks and a first control circuit unit 11. The first control circuit unit 11 is connected with the first cell block by a first local input/output line LIO1, is connected with the second cell block by a second local input/output line LIO2, is connected with the third cell block by a third local input/output line LIO3, and is connected with the fourth cell block by a fourth local input/output line LIO4. In a read operation for the first cell block, the first control circuit unit 11 receives the data of the first cell block through the first local input/output line LIO1, senses and amplifies the data, and outputs the amplified data to a first global input/output line GIO1. In a read operation for the second cell block, the first control circuit unit 11 receives the data of the second cell block through the second local input/output line LIO2, senses and amplifies the data, and outputs the amplified data to the first global input/output line GIO1. In a read operation for the third cell block, the first control circuit unit 11 receives the data of the third cell block through the third local input/output line LIO3, senses and amplifies the data, and outputs the amplified data to the first global input/output line GIO1. In a read operation for the fourth cell block, the first control circuit unit 11 receives the data of the fourth cell block through the fourth local input/output line LIO4, senses and amplifies the data, and outputs the amplified data to the first global input/output line GIO1. The first control circuit unit 11 includes a circuit such as an input/output line sense amplifier.

The second core region 2 comprises fifth to eighth cell blocks, a second control circuit unit 21, a first repeater 22 and a first data output unit 23. The second control circuit unit 21 is connected with the fifth cell block by a fifth local input/output line LIO5, is connected with the sixth cell block by a sixth local input/output line LIO6, is connected with the seventh cell block by a seventh local input/output line LIO7, and is connected with the eighth cell block by an eighth local input/output line LIO8. In a read operation for the fifth cell block, the second control circuit unit 21 receives the data of the fifth cell block through the fifth local input/output line LIO5, senses and amplifies the data, and outputs the amplified data to the first data output unit 23. In a read operation for the sixth cell block, the second control circuit unit 21 receives the data of the sixth cell block through the sixth local input/output line LIO6, senses and amplifies the data, and outputs the amplified data to the first data output unit 23. In a read operation for the seventh cell block, the second control circuit unit 21 receives the data of the seventh cell block through the seventh local input/output line LIO7, senses and amplifies the data, and outputs the amplified data to the first data output unit 23. In a read operation for the eighth cell block, the second control circuit unit 21 receives the data of the eighth cell block through the eighth local input/output line LIO8, senses and amplifies the data, and outputs the amplified data to the first data output unit 23. The second control circuit unit 21 includes a circuit such as an input/output line sense amplifier. The first repeater 22 is connected with the first control circuit unit 11 through the first global input/output line GIO1. In read operations for the first to fourth cell blocks, the first repeater 22 receives the data sensed and amplified by the first control circuit unit 11, through the first global input/output line GIO1, amplifies the received data, and outputs the amplified data to a second global input/output line GIO2. In read operations for the first to fourth cell blocks, the first data output unit receives the data transferred through the second global input/output line GIO2 and outputs the received data to a third global input/output line GIO3. In read operations for the fifth to eighth cell blocks, the first data output unit 23 receives the data transferred through the second control circuit unit 21 and outputs the received data to the third global input/output line GIO3. The first data output unit 23 includes circuits such as a pipe latch and a multiplexer, for consecutive data output in the read operations.

The third core region 3 comprises ninth to twelfth cell blocks and a third control circuit unit 31. The first control circuit unit 31 is connected with the ninth cell block by a ninth local input/output line LIO9, is connected with the tenth cell block by a tenth local input/output line LIO10, is connected with the eleventh cell block by an eleventh local input/output line LIO11, and is connected with the twelfth cell block by a twelfth local input/output line LIO12. In a read operation for the ninth cell block, the third control circuit unit 31 receives the data of the ninth cell block through the ninth local input/output line LIO9, senses and amplifies the data, and outputs the amplified data to a fourth global input/output line GIO4. In a read operation for the tenth cell block, the third control circuit unit 31 receives the data of the tenth cell block through the tenth local input/output line LIO10, senses and amplifies the data, and outputs the amplified data to the fourth global input/output line GIO4. In a read operation for the eleventh cell block, the third control circuit unit 31 receives the data of the eleventh cell block through the eleventh local input/output line LIO11, senses and amplifies the data, and outputs the amplified data to the fourth global input/output line GIO4. In a read operation for the twelfth cell block, the third control circuit unit 31 receives the data of the twelfth cell block through the twelfth local input/output line LIO12, senses and amplifies the data, and outputs the amplified data to the fourth global input/output line GIO4. The third control circuit unit 31 includes a circuit such as an input/output line sense amplifier.

The fourth core region 4 comprises thirteenth to sixteenth cell blocks, a fourth control circuit unit 41, a second repeater 42 and a second data output unit 43. The fourth control circuit unit 41 is connected with the thirteenth cell block by a thirteenth local input/output line LIO13, is connected with the fourteenth cell block by a fourteenth local input/output line LIO14, is connected with the fifteenth cell block by a fifteenth local input/output line LIO15, and is connected with the sixteenth cell block by a sixteenth local input/output line LIO16. In a read operation for the thirteenth cell block, the fourth control circuit unit 41 receives the data of the thirteenth cell block through the thirteenth local input/output line LIO13, senses and amplifies the data, and outputs the amplified data to the second data output unit 43. In a read operation for the fourteenth cell block, the fourth control circuit unit 41 receives the data of the fourteenth cell block through the fourteenth local input/output line LIO14, senses and amplifies the data, and outputs the amplified data to the second data output unit 43. In a read operation for the fifteenth cell block, the fourth control circuit unit 41 receives the data of the fifteenth cell block through the fifteenth local input/output line LIO15, senses and amplifies the data, and outputs the amplified data to the second data output unit 43. In a read operation for the sixteenth cell block, the fourth control circuit unit 41 receives the data of the sixteenth cell block through the sixteenth local input/output line LIO16, senses and amplifies the data, and outputs the amplified data to the second data output unit 43. The fourth control circuit unit 41 includes a circuit such as an input/output line sense amplifier. The second repeater 42 is connected with the third control circuit unit 31 through the fourth global input/output line GIO4. In read operations for the ninth to twelfth cell blocks, the second repeater 42 receives the data sensed and amplified by the third control circuit unit 31, through the fourth global input/output line GIO4, amplifies the received data, and outputs the amplified data to a fifth global input/output line GIO5. In read operations for the ninth to twelfth cell blocks, the second data output unit 43 receives the data transferred through the fifth global input/output line GIO5 and outputs the received data to a sixth global input/output line GIO6. In read operations for the thirteenth to sixteenth cell blocks, the second data output unit 43 receives the data transferred through the fourth control circuit unit 41 and outputs the received data to the sixth global input/output line GIO6. The second data output unit 43 includes circuits such as a pipe latch and a multiplexer, for consecutive data output in the read operations.

Hereafter, read operations of the semiconductor memory device configured as mentioned above will be described by being divided into a case in which read operations for the first cell block and the ninth cell block are performed with reference to FIG. 2, and a case in which read operations for the seventh cell block and the fifteenth cell block are performed with reference to FIG. 3.

Figure 2:
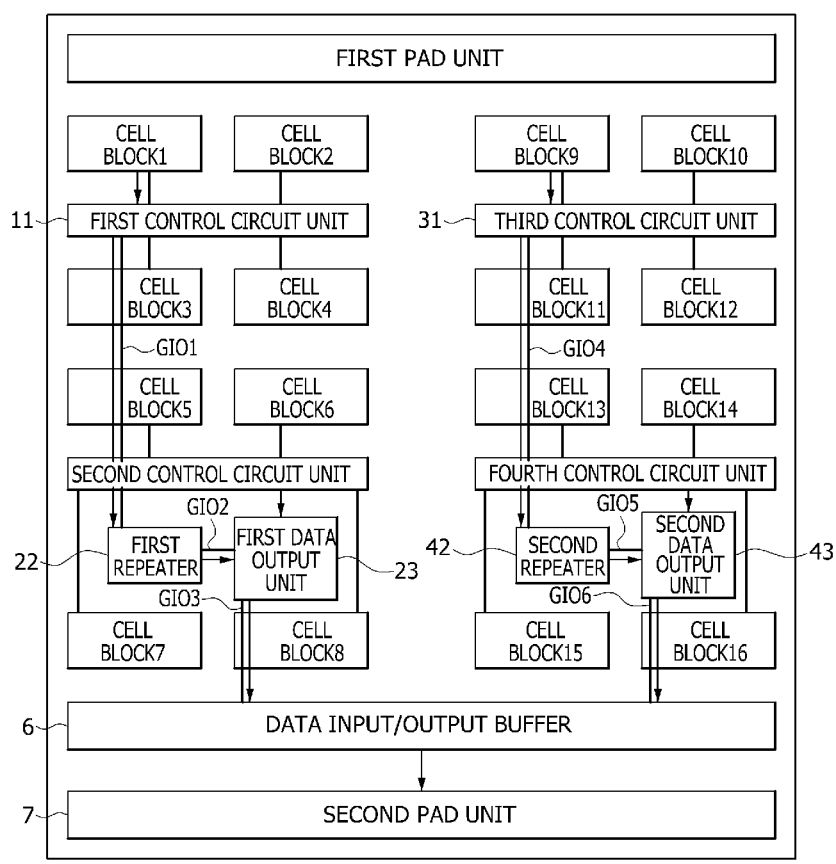
FIG. 2 is a block diagram illustrating a read operation for first and ninth cell blocks in the semiconductor memory device shown in FIG. 1.

Referring to FIG. 2, in the case where the read operations for the first cell block and the ninth cell block are performed, the first control circuit unit 11 receives the data of the first cell block through the first local input/output line LIO1, and senses and amplifies the received data. The third control circuit unit 31 receives the data of the ninth cell block through the ninth local input/output line LIO9, and senses and amplifies the received data. The first repeater 22 receives the data sensed and amplified by the first control circuit unit 11, through the first global input/output line GIO1, amplifies the received data, and transfers the amplified data to the second global input/output line GIO2. The second repeater 42 receives the data sensed and amplified by the third control circuit unit 31, through the fourth global input/output line GIO4, amplifies the received data, and transfers the amplified data to the fifth global input/output line GIO5. The first data output unit 23 receives the data transferred through the second global input/output line GIO2 and outputs the received data to the third global input/output line GIO3. The data input/output buffer 6 buffers the data transferred through the third global input/output line GIO3 and outputs the buffered data to the second pad unit 7. The second data output unit 43 receives the data transferred through the fifth global input/output line GIO5 and outputs the received data to the sixth global input/output line GIO6. The data input/output buffer 6 buffers the data transferred through the sixth global input/output line GIO6 and outputs the buffered data to the second pad unit 7.

Figure 3:
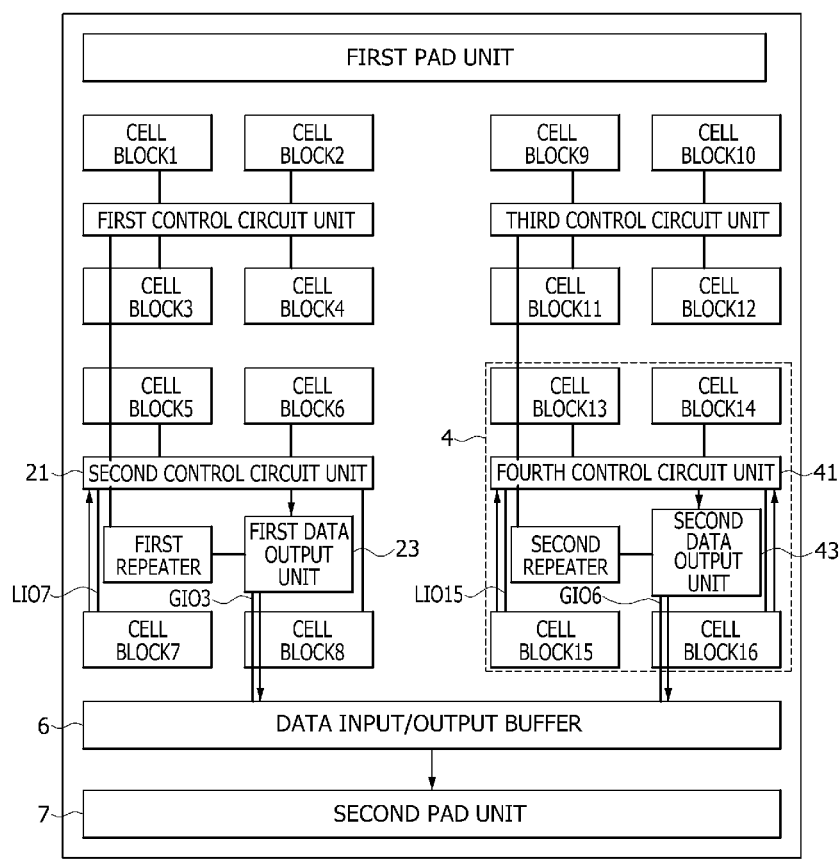
FIG. 3 is a block diagram illustrating a read operation for seventh and fifteenth cell blocks in the semiconductor memory device shown in FIG. 1.

Referring to FIG. 3, in the case where the read operations for the seventh cell block and the fifteenth cell block are performed, the second control circuit unit 21 receives the data of the seventh cell block through the seventh local input/output line LIO7, and senses and amplifies the received data. The fourth control circuit unit 41 receives the data of the fifteenth cell block through the fifteenth local input/output line LIO15, and senses and amplifies the received data. The first data output unit 23 receives the data transferred from the second control circuit unit 21 and outputs the received data to the third global input/output line GIO3. The data input/output buffer 6 buffers the data transferred through the third global input/output line GIO3 and outputs the buffered data to the second pad unit 7. The second data output unit 43 receives the data transferred from the fourth control circuit unit 41 and outputs the received data to the sixth global input/output line GIO6. The data input/output buffer 6 buffers the data transferred through the sixth global input/output line GIO6 and outputs the buffered data to the second pad unit 7.

As described above, the semiconductor memory device in accordance with an embodiment includes the first repeater 22 configured to receive the data through the first global input/output line GIO1, and amplify the received data in the case where read operations for the first to fourth cell blocks included in the first core region 1 are performed. The semiconductor memory device further includes the second repeater 42 configured to receive the data through the fourth global input/output line GIO4, and amplify the received data in the case where read operations for the ninth to thirteenth cell blocks included in the third core region 3 are performed. The first repeater 22 is disposed proximate the center portion of the second core region 2, and does not receive the data of the second core region 2. The second repeater 42 is disposed proximate the center portion of the fourth core region 4 and does not receive the data of the fourth core region 4. That is to say, the first repeater 22 and the second repeater 42 receive and amplify the data transferred through the first global input/output line GIO1 and the fourth global input/output line GIO4, only in read operations for the cell blocks included in the first core region 1 and the third core region 3. Accordingly, since global input/output lines for receiving the data of the cell blocks included in the second core region 2 and the fourth core region 4 are not needed, layout area may be reduced. Moreover, since the first repeater 22 and the second repeater 42 are driven only in read operations for the cell blocks included in the first core region 1 and the third core region 3, signal gain may be reduced when compared to the case of amplifying the data transferred from the cell blocks included in all the core regions 1, 2, 3 and 4. Therefore, power consumption by the first repeater 22 and the second repeater 42 may be reduced.

Embodiments have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
a first core region and a second core region disposed along a first reference line substantially parallel to a major axis, the first reference line connecting an input pad and an output pad;
first and second cell blocks disposed in the first core region along the first reference line;
third and fourth cell blocks disposed in the second core region along the first reference line; and
a repeater positioned between the third and fourth cell blocks, and configured to receive data outputted from the first cell block or the second cell block, through a first global input/output line in a read operation for the first cell block or the second cell block, amplify the received data and transfer the amplified data to a second global input/output line.

2. The semiconductor memory device according to claim 1, further comprising:
a data output unit configured to receive the data amplified by the repeater, through the second global input/output line, and output the received data to a third global input/output line.

3. The semiconductor memory device according to claim 2, wherein the data output unit comprises a pipe latch and a multiplexer to consecutively output the data transferred through the second global input/output line.

4. The semiconductor memory device according to claim 2, wherein the data output unit and the repeater lie along a second reference line substantially normal to the major axis.

5. The semiconductor memory device according to claim 2, further comprising:

a data input/output buffer configured to receive data through the third global input/output line, buffer the received data and output the buffered data through a pad unit.

6. The semiconductor memory device according to claim 2, further comprising:
a control circuit unit connected with the third cell block though a first local input/output line and connected with the fourth cell block through a second local input/output line.

7. The semiconductor memory device according to claim 6, wherein the control circuit unit receives data of the third cell block through the first local input/output line in the read operation for the third cell block, senses and amplifies the received data, and outputs the sensed and amplified data to the data output unit through the second global input/output line.

8. The semiconductor memory device according to claim 7, wherein the control circuit unit receives data of the fourth cell block through the second local input/output line in the read operation for the fourth cell block, senses and amplifies the received data, and outputs the sensed and amplified data to the data output unit through the second global input/output line.

9. The semiconductor memory device according to claim 1, further comprising:
a control circuit unit connected with the first cell block though a first local input/output line, connected with the second cell block through a second local input/output line, and connected with the repeater through the first global input/output line.

10. The semiconductor memory device according to claim 9, wherein the control circuit unit receives data of the first cell block through the first local input/output line in the read operation for the first cell block, senses and amplifies the received data, and outputs the sensed and amplified data to the first global input/output line.

11. The semiconductor memory device according to claim 10, wherein the control circuit unit receives data of the second cell block through the second local input/output line in the read operation for the second cell block, senses and amplifies the received data, and outputs the sensed and amplified data to the first global input/output line.

12. A semiconductor memory device comprising:
a first control circuit unit positioned between first and second cell blocks which are disposed in a first core region along a first reference line substantially parallel to a major axis, the first reference line connecting an input pad and an output pad, the first control unit connected with the first cell block through a first local input/output line, and connected with the second cell block through a second local input/output line;
a second control circuit unit positioned between third and fourth cell blocks which are disposed in a second core region along the first reference line, connected with the third cell block through a third local input/output line, and connected with the fourth cell block through a fourth local input/output line; and a repeater positioned between the third and fourth cell blocks, and configured to receive data outputted from the first cell block or the second cell block, through a first global input/output line in a read operation for the first cell block or the second cell block, amplify the received data and transfer the amplified data to a second global input/output line,
wherein the first core region and the second core region are disposed along the first reference line.

13. The semiconductor memory device according to claim 12, further comprising:
a data output unit configured to receive the data amplified by the repeater, through the second global input/output line, and output the received data to a third global input/output line.

14. The semiconductor memory device according to claim 13, wherein the data output unit comprises a pipe latch and a multiplexer to consecutively output the data transferred through the second global input/output line.

15. The semiconductor memory device according to claim 13, wherein the data output unit and the repeater lie along a second reference line substantially normal to the major axis.

16. The semiconductor memory device according to claim 13, further comprising:
a data input/output buffer configured to receive data through the third global input/output line, buffer the received data and output the buffered data through a pad unit.

17. The semiconductor memory device according to claim 13, wherein the second control circuit unit receives data of the third cell block through the third local input/output line in the read operation for the third cell block, senses and amplifies the received data, and outputs the sensed and amplified data to the data output unit through the second global input/output line.

18. The semiconductor memory device according to claim 17, wherein the second control circuit unit receives data of the fourth cell block through the fourth local input/output line in the read operation for the fourth cell block, senses and amplifies the received data, and outputs the sensed and amplified data to the data output unit through the second global input/output line.

19. The semiconductor memory device according to claim 12, wherein the first control circuit unit receives data of the first cell block through the first local input/output line in the read operation for the first cell block, senses and amplifies the received data, and outputs the sensed and amplified data to the first global input/output line.

20. The semiconductor memory device according to claim 19, wherein the first control circuit unit receives data of the second cell block through the second local input/output line in the read operation for the second cell block, senses and amplifies the received data, and outputs the sensed and amplified data to the first global input/output line.

* * * * *